United States Patent
Porter et al.

(10) Patent No.: US 9,983,757 B2
(45) Date of Patent: May 29, 2018

(54) INDUCTIVE TOUCH SENSOR USING A FLEXIBLE COIL

(75) Inventors: Stephen B. Porter, Gilbert, AZ (US); Dan Termer, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 98 days.

(21) Appl. No.: 13/355,206

(22) Filed: Jan. 20, 2012

(65) Prior Publication Data
US 2013/0187742 A1    Jul. 25, 2013

(51) Int. Cl.
| G06F 3/045 | (2006.01) |
| H01F 5/00 | (2006.01) |
| H01F 27/28 | (2006.01) |
| G06F 3/046 | (2006.01) |
| G06F 3/02 | (2006.01) |

(52) U.S. Cl.
CPC ........... *G06F 3/046* (2013.01); *G06F 3/0202* (2013.01); *H03K 2217/96038* (2013.01)

(58) Field of Classification Search
CPC .............. H01F 27/2804; H01F 5/0003; H01F 17/0006; G06F 3/0202; G06F 3/046; H03K 2217/96038
USPC ................. 336/200, 232, 10–41, 45, 73–79, 336/115–129; 345/173, 174, 158
See application file for complete search history.

(56) References Cited

U.S. PATENT DOCUMENTS

| 4,233,523 A | 11/1980 | Jarder et al. ................. 307/119 |
| 7,312,790 B2 | 12/2007 | Sato et al. .................... 345/173 |
| 7,800,362 B1 | 9/2010 | Ogawa ........................ 324/209 |
| 7,944,215 B2* | 5/2011 | Howard et al. ............... 324/654 |
| 8,847,892 B2 | 9/2014 | Kreit et al. ................... 345/173 |
| 2001/0011999 A1* | 8/2001 | Mochizuki .................... 345/168 |
| 2001/0035854 A1* | 11/2001 | Rosenberg .................... A63F 13/06 345/156 |
| 2004/0233178 A1* | 11/2004 | Silk et al. ..................... 345/179 |
| 2006/0232269 A1* | 10/2006 | Sills ........................ G06F 3/046 324/207.17 |
| 2007/0246333 A1* | 10/2007 | Kawaura .............. H03K 17/962 200/61.45 M |
| 2009/0014228 A1 | 1/2009 | Kawaura et al. ............ 180/274 |
| 2009/0160789 A1* | 6/2009 | Kreit et al. ................... 345/173 |

(Continued)

FOREIGN PATENT DOCUMENTS

| CN | 1745388 A | 3/2006 | ............. G06K 11/00 |
| CN | 201218805 Y | 4/2009 | ............. G01N 27/90 |

(Continued)

OTHER PUBLICATIONS

International Search Report and Written Opinion, Application No. PCT/US2013/021833, 11 pages, dated Mar. 21, 2013.

(Continued)

*Primary Examiner* — Mangtin Lian
(74) *Attorney, Agent, or Firm* — Slayden Grubert Beard PLLC

(57) ABSTRACT

An inductive touch sensor comprises an inductors disposed in or on a deformable substrate. When a force is applied to the deformable substrate the physical shape of the inductor will change and thereby change its inductance value. The change in the inductance value can be detected and used to indicate actuation of an associated touch key of the inductive touch sensor. A plurality of inductive touch sensors may be used to form a touch panel.

19 Claims, 9 Drawing Sheets

(56) References Cited

U.S. PATENT DOCUMENTS

| | | | | |
|---|---|---|---|---|
| 2009/0250267 A1* | 10/2009 | Heubel | ................... | G06F 3/041 178/18.03 |
| 2010/0207907 A1* | 8/2010 | Tanabe et al. | ................. | 345/174 |
| 2011/0012760 A1* | 1/2011 | Klinghult | ....................... | 341/32 |
| 2011/0084933 A1* | 4/2011 | Curtis et al. | ................... | 345/174 |
| 2011/0193794 A1* | 8/2011 | Hu et al. | ....................... | 345/173 |
| 2011/0267300 A1* | 11/2011 | Serban et al. | ................ | 345/174 |
| 2012/0029343 A1* | 2/2012 | Wasson et al. | ................ | 600/424 |
| 2012/0098789 A1* | 4/2012 | Ciesla et al. | .................. | 345/174 |
| 2012/0105333 A1* | 5/2012 | Maschmeyer | .......... | G06F 3/016 345/173 |
| 2012/0299872 A1* | 11/2012 | Nishikawa et al. | .......... | 345/174 |

FOREIGN PATENT DOCUMENTS

| | | | | |
|---|---|---|---|---|
| CN | 101840279 A | 9/2010 | ............ | G06F 3/041 |
| CN | 102087560 A | 6/2011 | ............ | G06F 3/041 |
| DE | 3509411 C1 | 4/1986 | ............. | B65H 45/18 |
| JP | 5891835 B2 | 3/1916 | ............ | B32B 27/30 |
| JP | 53142680 A | 12/1978 | ............ | H01H 13/16 |
| JP | 54114278 A | 9/1979 | ................ | G01L 1/14 |
| JP | 2002236059 A | 8/2002 | ............... | G01L 1/14 |
| JP | 2005321592 A | 11/2005 | ............... | G01L 5/16 |
| JP | 3943876 B2 | 7/2007 | ............... | G06F 1/16 |
| JP | 2007218892 A | 8/2007 | ............... | G01L 5/00 |
| JP | 2008207629 A | 9/2008 | ............. | B60R 21/00 |
| JP | 2010176438 A | 8/2010 | ............... | G06F 3/02 |
| WO | 2009/034677 A1 | 3/2009 | ............... | G01L 1/14 |
| WO | WO2011/071096 A1 * | 6/2011 | | |

OTHER PUBLICATIONS

European Office Action, Application No. 13702153.1, 6 pages, dated May 18, 2017.

Taiwan Office Action, Application No. 102102108, 25 pages, dated Feb. 16, 2017.

Japanese Office Action, Application No. 2014553392, 17 pages, dated Oct. 17, 2016.

Chinese Office Action, Application No. 201380009372.4, 19 pages, dated May 25, 2016.

Chinese Office Action, Application No. 201380009372.4, 19 pages, dated Dec. 30, 2016.

* cited by examiner

INDUCTIVE TOUCH SENSOR USING A FLEXIBLE COIL

TECHNICAL FIELD

The present disclosure relates to inductive touch sensors, and more particularly, to an inductive touch sensor using a flexible coil.

BACKGROUND

Inductive touch sensor technology may be used as an alternative to capacitive touch sensor technology. Current technology inductive touch sensors comprise a target (surface being touched or pressed), a spacer and an inductance coil. When the target is actuated (e.g., touched) the coil inductance changes value. Detection of this change in the inductance value of the coil indicates actuation of the inductive touch sensor. Manufacturing of an inductive touch panel, comprise a plurality of inductive touch sensors, and requires assembly of a sensor etched and sandwiched on a printed circuit board (PCB), generally at final assembly of a product. The spacer must be placed between the PCB which contains the inductance coils, one for each key or button, and the targets for each key or button. Current manufacturing technologies consist of producing the PCB, the spacer, laminating the spacer to the PCB and then mounting the PCB/Spacer assembly to the target panel. Tight tolerances are required between the target and the inductive coil that will change its inductance value.

SUMMARY

What is needed is a simplified and inexpensive way to manufacture an inductive touch sensor that can be used in a touch panel.

According to an embodiment, an inductive touch sensor may comprise: a flexible substrate; an inductor in mechanical communication with the flexible substrate, the inductor and the flexible substrate having a first position and a second position, wherein the flexible substrate and the inductor assume the second position when a force is applied thereto; and wherein the inductor has a first inductance value when in the first position and a second inductance value when in the second position.

According to a further embodiment, the first inductance value is greater than the second inductance value. According to a further embodiment, the first inductance value is less than the second inductance value. According to a further embodiment, the flexible substrate has openings therein to allow distances between coil turns of the inductor to increase and decrease depending upon whether or not the force is being applied to the flexible substrate and inductor. According to a further embodiment, the distances between the coil turns increase when the force is applied. According to a further embodiment, the distances between the coil turns decrease when the force is applied.

According to a further embodiment, the flexible substrate and inductor are substantially flat when the force is not applied thereto, and concave when the force is applied thereto. According to a further embodiment, the flexible substrate and inductor are convex when the force is not applied thereto, and less convex when the force is applied thereto. According to a further embodiment, the flexible substrate and inductor are convex when the force is not applied thereto, and substantially flat when the force is applied thereto. According to a further embodiment, the inductor is embedded in the flexible substrate. According to a further embodiment, the inductor is coterminous with the flexible substrate.

According to a further embodiment, a support substrate and ridge spacers between the support substrate and the flexible substrate are added, wherein the support substrate, ridge spacers and flexible substrate form a cavity. According to a further embodiment, the cavity is filled with a flexible material.

According to a further embodiment, a conductive ground plane in the cavity and on an inside face of the support substrate is added, wherein the conductive ground plane influences the second inductance value of the inductor when in the second position.

According to a further embodiment, a magnetic material is added in the cavity and on an inside face of the support substrate, wherein the magnetic material influences the second inductance value of the inductor when in the second position. According to a further embodiment, the magnetic material is selected from the group consisting of ferrite and powered iron.

According to a further embodiment, an electronic circuit is coupled to the inductor for measuring inductance values thereof. According to a further embodiment, the electronic circuit is a mixed signal integrated circuit device.

According to another embodiment, an inductive touch sensor panel may comprise: a flexible substrate divided into a plurality of touch key areas arranged in a matrix; a plurality of inductors in mechanical communication with the flexible substrate, each of the plurality of inductors associated with a respective one of the plurality of touch key areas, each of the plurality of inductors and the plurality of touch key areas having a first position and a second position, wherein each touch key area and inductor assume the second position when a force is applied thereto; wherein the inductor has a first inductance value when in the first position and a second inductance value when in the second position; a support substrate; and ridge spacers between the support substrate and each of plurality of touch key areas, wherein the support substrate, ridge spacers and the plurality of touch key areas form a plurality of cavities.

According to yet another embodiment, an inductive touch sensor may comprise: a flexible substrate; a support substrate; ridge spacers between the support substrate and the flexible substrate, wherein the support substrate, ridge spacers and flexible substrate form a cavity; an inductor comprising a coiled spring, a first end of the inductor is in mechanical and electrical communications with the flexible substrate and a second end of the inductor is in mechanical and electrical communications with the support substrate; the inductor has a first inductance value when in a first position and a second inductance value when in a second position; and the inductor assumes the second position when a force is applied to the flexible substrate.

BRIEF DESCRIPTION OF THE DRAWINGS

A more complete understanding of the present disclosure thereof may be acquired by referring to the following description taken in conjunction with the accompanying drawings wherein.

Figure 1:
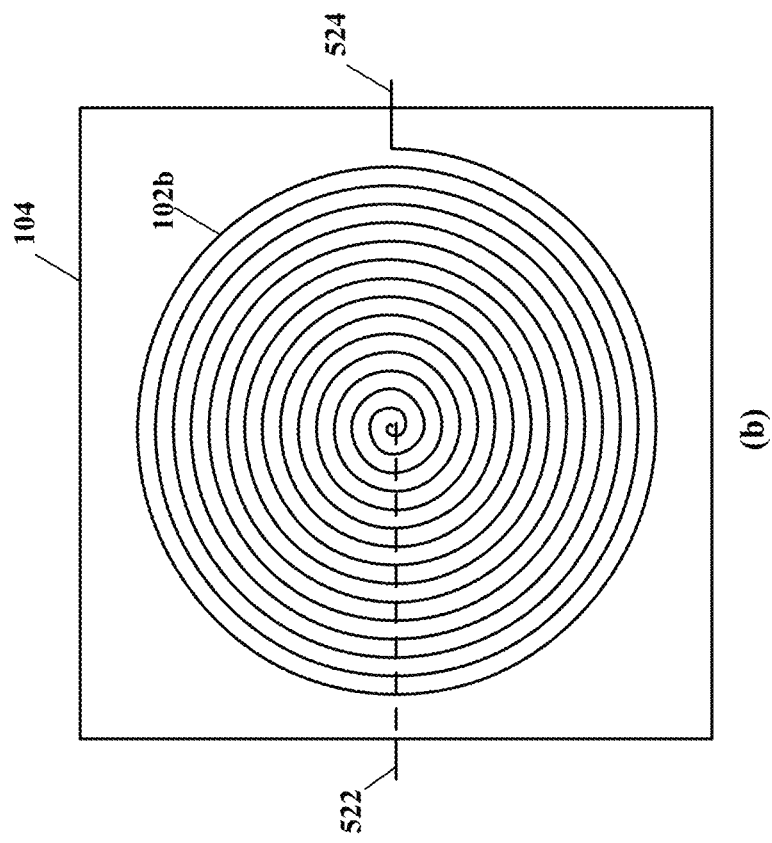
FIG. 1 illustrates schematic plan views of an inductor that is formed as a spiral coil of an inductive touch key for non-actuated and actuated conditions, according to a specific example embodiment of this disclosure.
Figure 1:
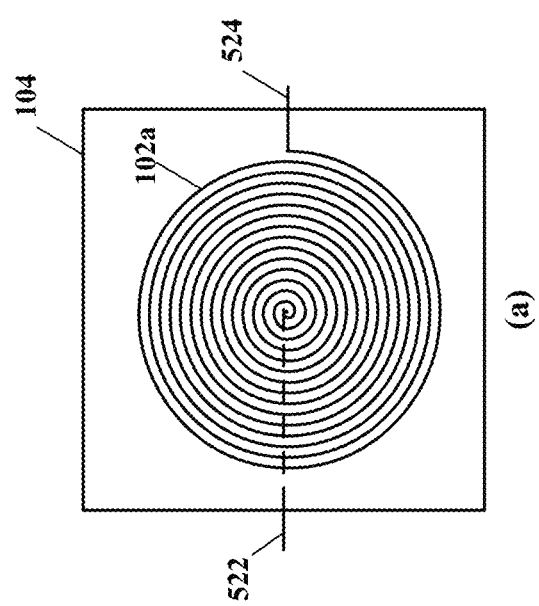

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

An inductive touch sensor comprises an inductor disposed in or on a deformable substrate. When a force is applied to the deformable substrate the physical shape of the inductor changes and thereby changes its inductance value. The change in the inductance value can be detected and used to indicate actuation of an associated touch key of the inductive touch sensor. A plurality of inductive touch sensors may be used to form a touch panel.

Referring now to the drawings, the details of an example embodiment is schematically illustrated. Like elements in the drawings will be represented by like numbers, and similar elements will be represented by like numbers with a different lower case letter suffix.

Figure 3:
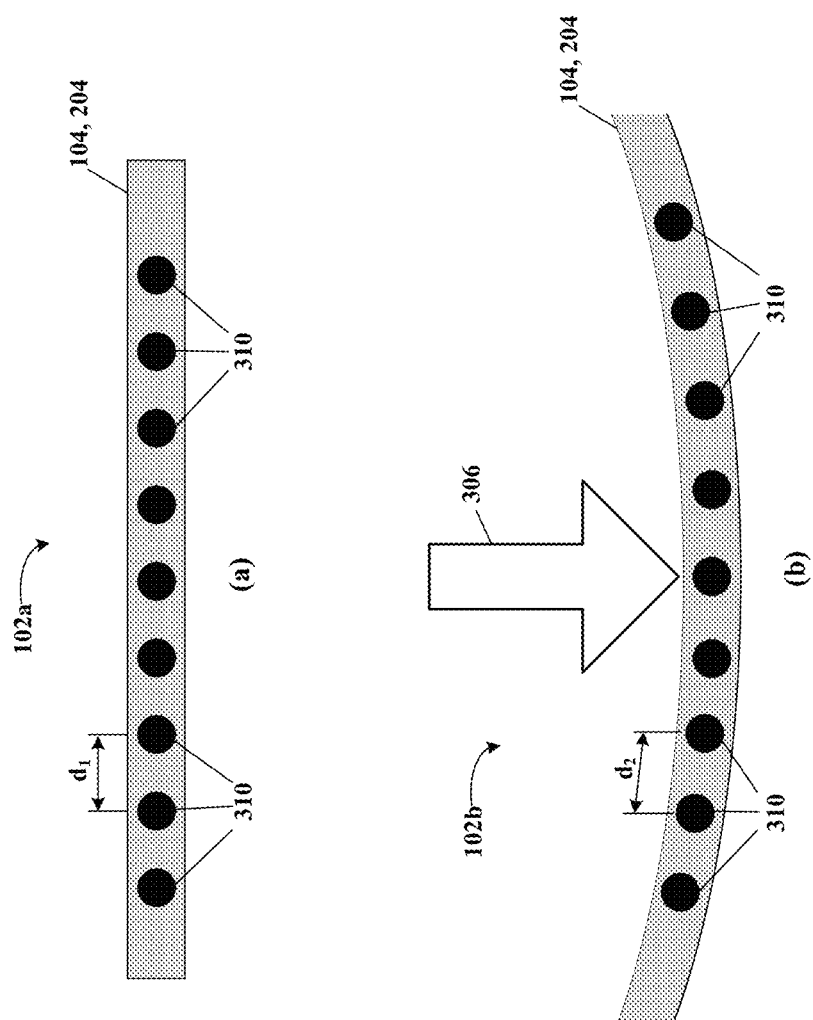
FIG. 3 illustrates schematic elevational cutaway views of the inductor of the inductive touch key shown in FIG. 1 or 2, according to specific example embodiments of this disclosure.
Figure 4:
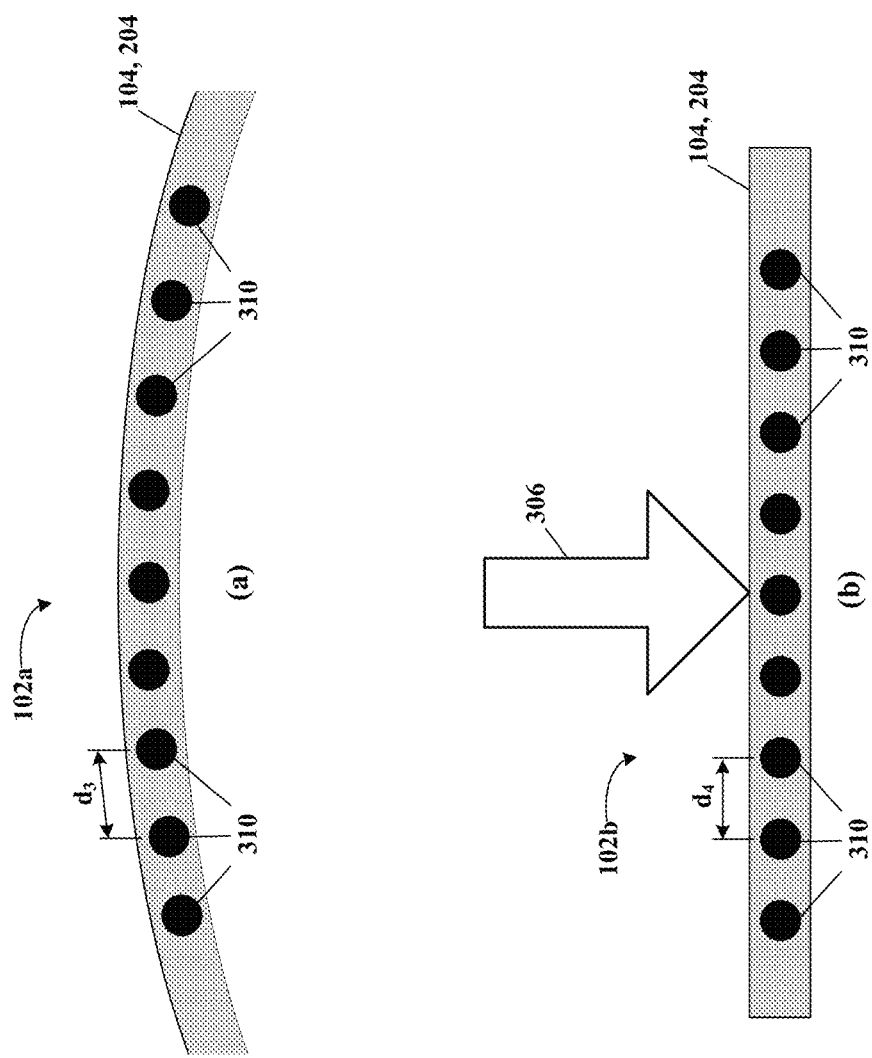
FIG. 4 illustrates schematic elevational cutaway views of the inductor of the inductive touch key shown in FIG. 1 or 2, according to specific example embodiments of this disclosure.

Referring to FIG. 1, depicted are schematic plan views of an inductor that is formed as a spiral coil of an inductive touch key for non-actuated and actuated conditions, according to a specific example embodiment of this disclosure. An inductor coil 102a is shown in a non-actuated state, and the inductor coil 102b is shown in an actuated state, as more fully described hereinafter. The inductor coil 102 is wound in a substantially flat spiral configuration in or on a deformable substrate 104 (see FIGS. 3 and 4). When a force, e.g., finger push, is disposed on the inductor coil 102 and the deformable substrate 104 the electrically conductive turns of the inductor coil 102 will become farther apart (separate) as shown in the (b) drawing of FIG. 1. The deformable substrate 104 is shown deformed, e.g., stretched, in two dimensions (X and Y axes). A third dimension (Z-axis is shown in FIGS. 3 and 4) also stretches the substrate 104 to further increase the distance between the coil turns. By increasing the separation between the coil turns, the inductance value of the inductor coil 102 will decrease. This change in the inductance value can be measured and used to indicate activation of the inductor coil 102 by an external force, e.g., finger push. Electrical connections 522 and 524 are adapted to couple the inductor coil 102 to electronic measurement circuits (not shown) for determination of the inductance value thereof. It is contemplated and within the scope of this disclosure that slots may be cut in the deformable substrate 104 so as to facilitate separation of the coil turns.

Figure 2:
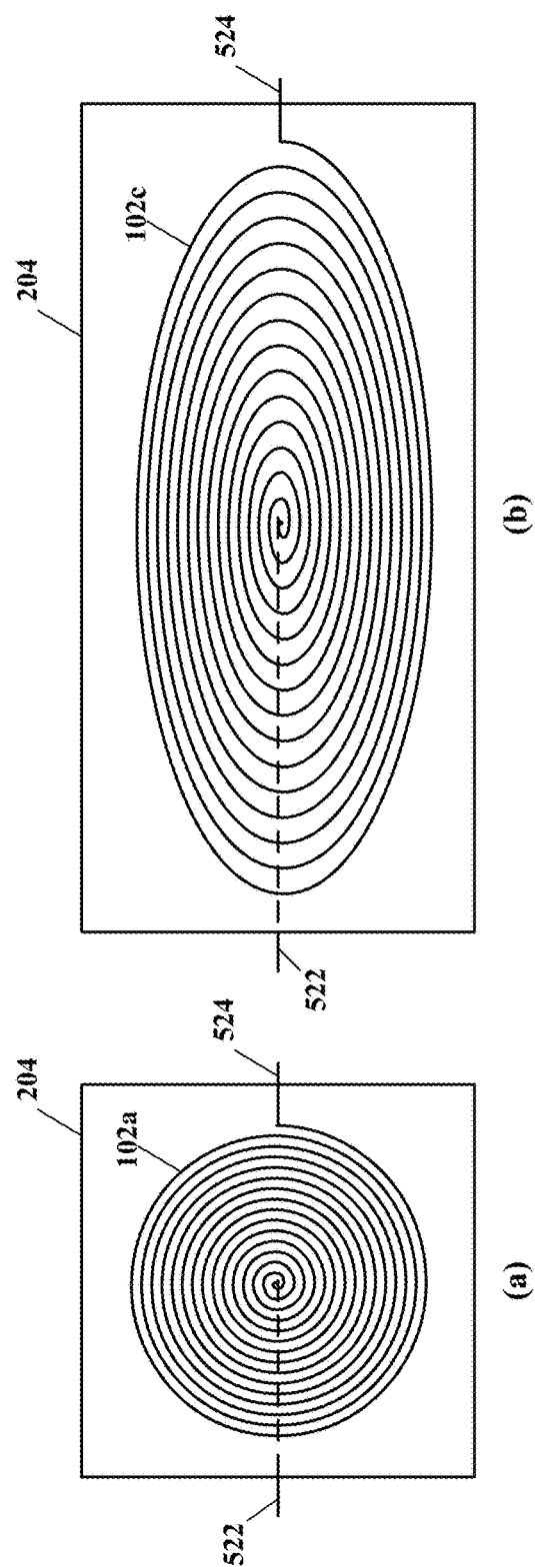
FIG. 2 illustrates schematic plan views of an inductor that is formed as a spiral coil of an inductive touch key for non-actuated and actuated conditions, according to another specific example embodiment of this disclosure.

Referring to FIG. 2, depicted are schematic plan views of an inductor that is formed as a spiral coil of an inductive touch key for non-actuated and actuated conditions, according to another specific example embodiment of this disclosure. The inductor coil 102a is shown in a non-actuated state, and the inductor coil 102c is shown in an actuated state, as more fully described hereinafter. The inductor coil 102 is wound in a substantially flat spiral configuration in or on a deformable substrate 204 (see FIGS. 3 and 4). When a force, e.g., finger push, is disposed on the inductor coil 102 and the deformable substrate 204 the electrically conductive turns of the inductor coil 102 will become farther apart (separate) as shown in the (b) drawing of FIG. 2. The deformable substrate 204 is shown deformed, e.g., stretched, in one dimension. (X axis). A third dimension (Z-axis is shown in FIGS. 3 and 4) also stretches the substrate 204 to further increase the distance between the coil turns. By increasing the separation between the coil turns, the inductance value of the inductor coil 102 will decrease. This change in the inductance value can be measured and used to indicate activation of the inductor coil 102 by an external force, e.g., finger push. It is contemplated and within the scope of this disclosure that slots may be cut in the deformable substrate 104 so as to facilitate separation of the coil turns.

Referring to FIG. 3, depicted are schematic elevational cutaway views of the inductor of the inductive touch key shown in FIG. 1 or 2, according to specific example embodiments of this disclosure. The inductor coil 102 is shown embedded into the flexible substrate 104. When substrate 104 does not have a force on its face then there is no deformation thereof and the turns of the coil 102a are spaced at a distance $d_1$ therebetween. The coil 102a configuration will have a first inductance value. When a force 306 is applied to a face of the substrate 104, deflection thereof occurs and the turns of the coil 102b become farther apart. As shown in (b), the turns of the coil 102b are spaced at a distance $d_2$ therebetween, where $d_2 > d_1$. Now the coil 102b has a second inductance value that is less than the first inductance value. This is easily measured by electronic circuits.

It is contemplated and within the scope of this disclosure that the coil 102 may be fabricated on a surface of the substrate 104 (coterminous), or the coil 102 may be fabricated without any substrate at all. The coil 102 may be self supporting and deformably springy so as to return to its un-actuated shape. So long as the shape of the coil 102 changes wherein the distance between the turns thereof change, so will the inductance value thereof change. As shown in FIG. 3 the substrate 104 is normally flat when no force 306 is applied to its surface (face), and becomes concave when the force 306 is applied thereto.

Referring to FIG. 4, depicted are schematic elevational cutaway views of the inductor of the inductive touch key shown in FIG. 1 or 2, according to specific example embodiments of this disclosure. The inductor coil 102 is shown embedded into a convex curved flexible substrate 204. When the convex curved substrate 204 does not have a force on its face then there is no deformation thereof, the face thereof remains convex, and the turns 310 of the coil 102a are spaced at a distance $d_3$ therebetween. The coil 102a configuration will have a third inductance value. When a force 306 is applied to a convex face of the substrate 204, deflection thereof occurs and the turns 310 of the coil 102b become closer together. As shown in (b), the turns 310 of the coil 102b are spaced at a distance $d_4$ therebetween, where $d_3 > d_4$. Now the coil 102b has a fourth inductance value that is greater than the third inductance value. This is easily measured by electronic circuits.

It is contemplated and within the scope of this disclosure that the coil 102 may be fabricated on a surface of the convex substrate 204, or the coil 102 may be fabricated without any substrate at all. The coil 102 may be self supporting and deformably springy so as to return to its un-actuated shape. So long as the shape of the coil 102 changes wherein the distance between the turns thereof change, so will the inductance value thereof. As shown in FIG. 4 the substrate 204 is normally convex curved when no force 306 is applied to its surface (face), and may become substantially flat (e.g., less convex curved) when the force 306 is applied thereto. The configuration shown in FIG. 4 is easily adapted to raised, tactile touch keys on a keypad (see FIG. 8).

Figure 5:
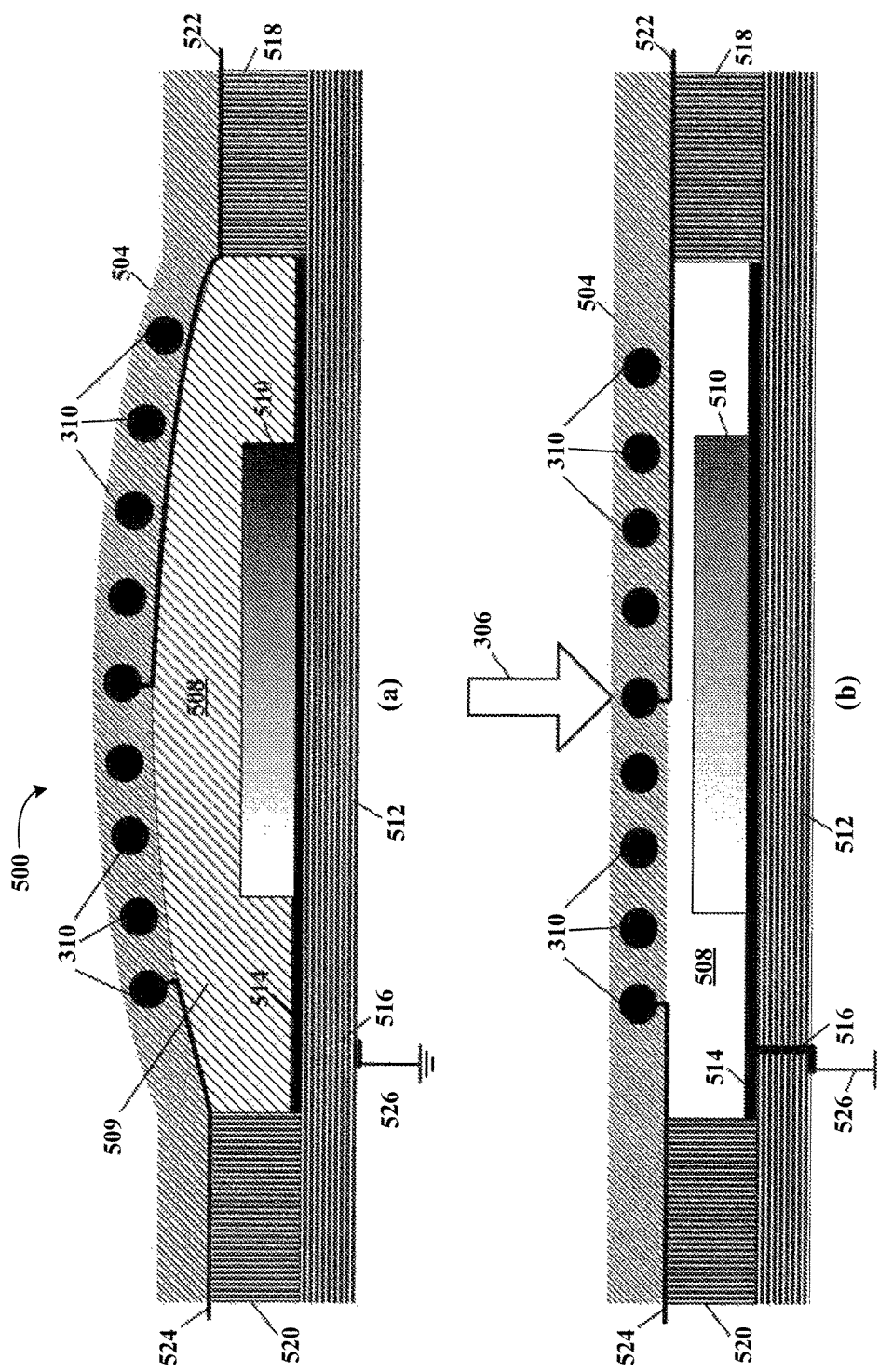
FIG. 5 illustrates schematic elevational cutaway views of an inductive touch key using the inductor and substrate shown in FIG. 4, according to a specific example embodiment of this disclosure.

Referring to FIG. 5, depicted are schematic elevational cutaway views of an inductive touch key using the inductor and substrate shown in FIG. 4, according to a specific example embodiment of this disclosure. An inductive touch key, generally represented by the numeral 500, comprises inductor coil 102 having turns 310 embedded in a convex curved flexible substrate 504 that is attached to ridged supports 518 and 520. These ridged supports 518 and 520 space the substrate 504 from a support substrate 512, e.g., printed circuit board (PCB), that may be common to a plurality of inductive touch keys 800 (see FIG. 8). A deformable space 508 is disposed between the convex curved flexible substrate 504 and the support substrate 512. The deformable space 508 may be air or gas (empty), or it may be filled with a deformable material 509, e.g., foam, silicon gel, etc.

Optionally, a magnetic material 510, e.g., ferrite, powered iron, etc., having properties that influence the inductance value of the coil 102, may be located in the space 508. A conductive ground plane 514 may be disposed on a face of the support substrate 512 and connected to ground or a power source common 526 with, for example, a printed circuit board via 516. The purpose of this conductive ground plane 514 is to influence (increase) the inductance value of the coil 102 as the turns 310 of the coil 102 are moved closer to it, drawing (b) showing force 306 applied to a face of the convex curved flexible substrate 504. It is contemplated and within the scope of this disclosure that the changes in spacing between the turns 310 of the coil 102, the ground plane 514, and/or the magnetic material 510 influence the inductance value of the coil 102 as it changes position relative to the support substrate 512 due to the force 306 being applied to the face of the convex curved flexible substrate 504, compare drawing (a) to drawing (b) of FIG. 5. Electrical connections 522 and 524 are used to couple the inductor coil 102 to electronic measurement circuits (see FIG. 9) for determining the inductance value thereof.

Figure 6:
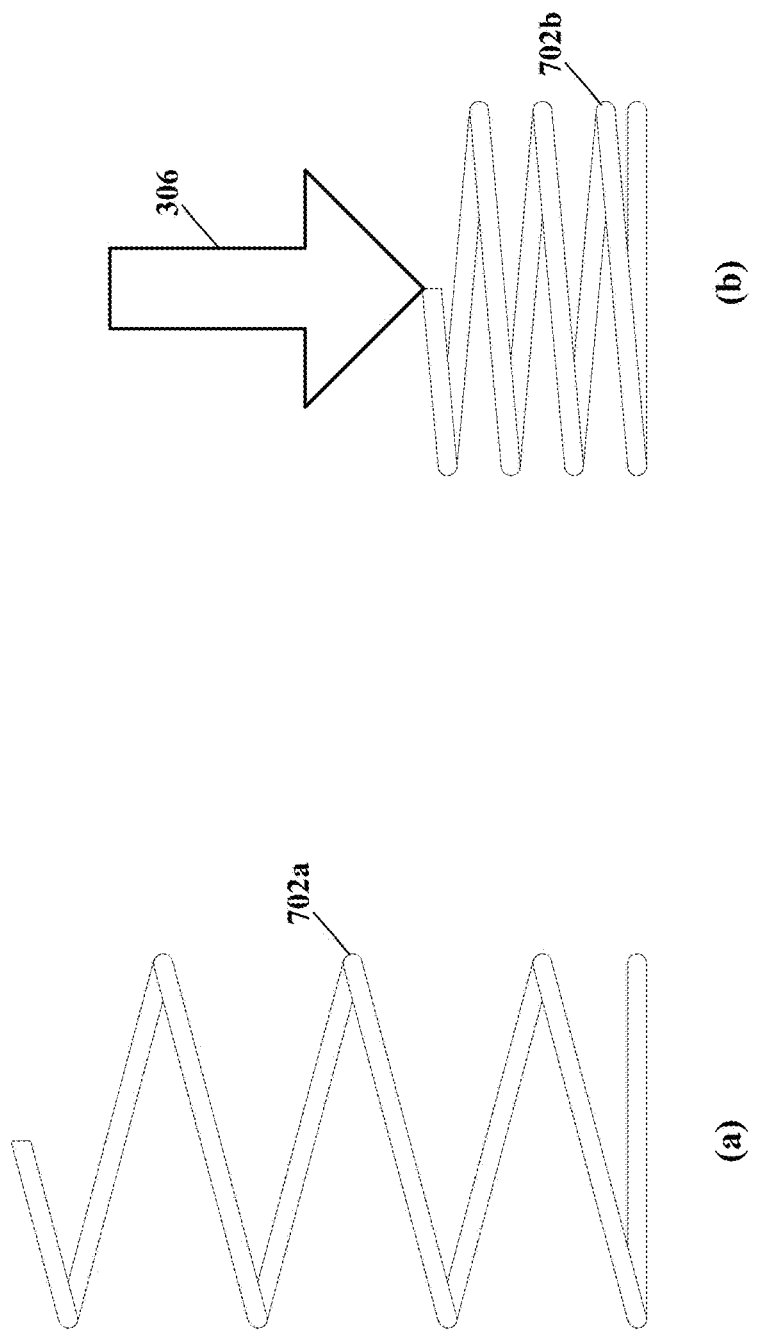
FIG. 6 illustrates schematic elevational views of an inductor that is formed as a spring coil of an inductive touch key for non-actuated and actuated conditions, according to yet another specific example embodiment of this disclosure.

Referring to FIG. 6, depicted are schematic elevational views of an inductor that is formed as a spring coil of an inductive touch key for non-actuated and actuated conditions, according to yet another specific example embodiment of this disclosure. An inductor coil 702a is shown in a non-actuated state, and the inductor coil 702b is shown in an actuated state, as more fully described hereinafter. The inductor coil 702 is wound in a deformable spring shape. When a force 306, e.g., finger push, is disposed on the inductor coil 702 the electrically conductive turns of the inductor coil 702 will become closer together as shown in the (b) drawing of FIG. 6. By decreasing the separation between the coil turns, the inductance value of the inductor coil 702 will increase. This change in the inductance value can be measured and used to indicate activation of the inductor coil 702 by an external force, e.g., finger push.

Figure 7:
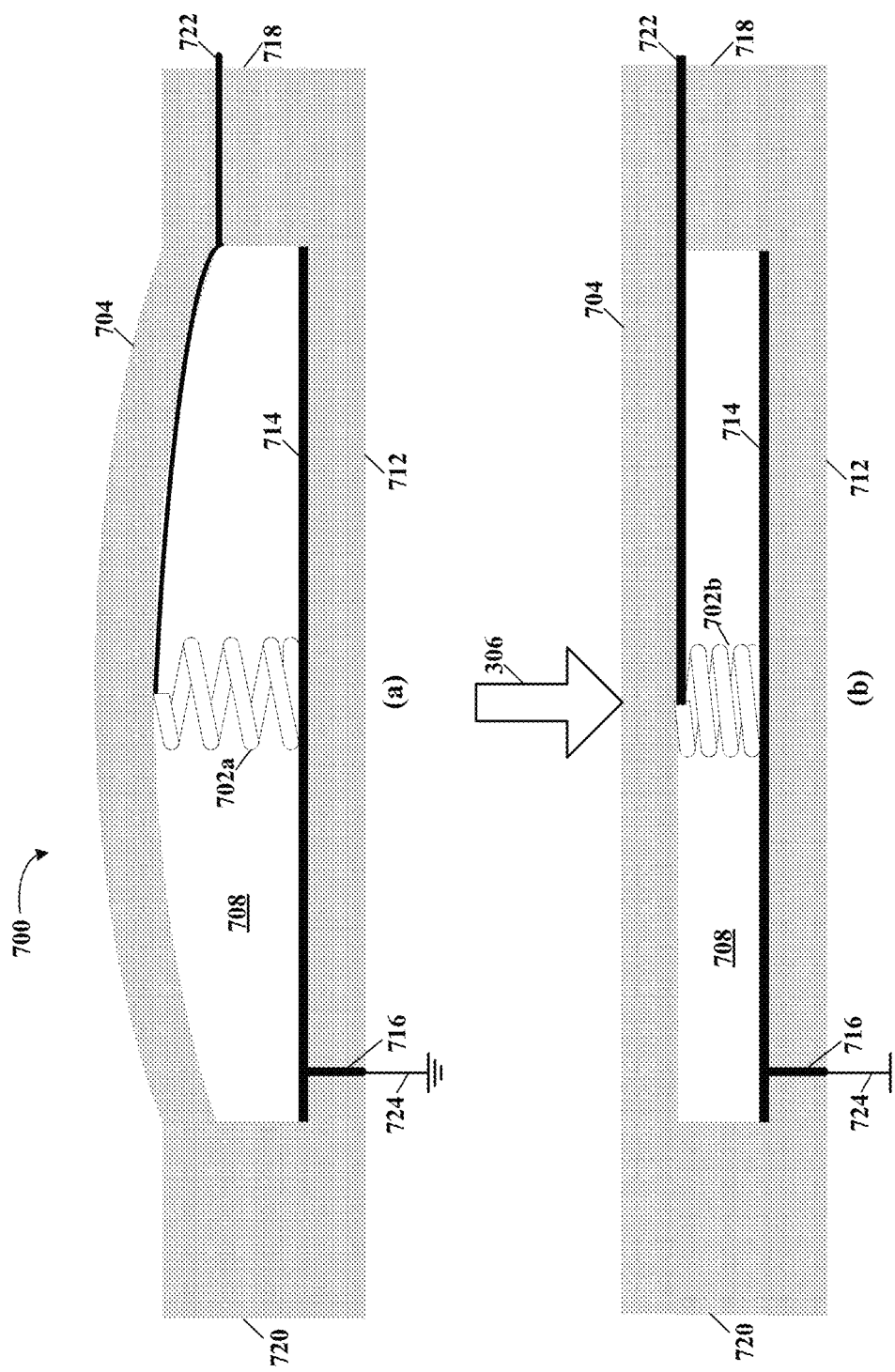
FIG. 7 illustrates schematic elevational cutaway views of an inductive touch key using the inductor shown in FIG. 6, according to specific example embodiments of this disclosure.

Referring to FIG. 7, depicted are schematic elevational cutaway views of an inductive touch key using the inductor shown in FIG. 6, according to specific example embodiments of this disclosure. An inductive touch key, generally represented by the numeral 700, comprises a spring shaped inductor coil 702, a convex curved flexible substrate 704 that is attached to ridged supports 718 and 720. These ridged supports 718 and 720 space the substrate 704 from a support substrate 712, e.g., printed circuit board (PCB), that may be common to a plurality of inductive touch keys 800 (see FIG. 8). A deformable space 708 is disposed between the convex curved flexible substrate 704 and the support substrate 712. The deformable space 708 may be air or gas (empty), or it may be filled with a deformable material, e.g., foam, silicon gel, etc.

A conductive ground plane 714 may be disposed on a face of the support substrate 712 and connected to ground or a power source common 724 with, for example, a printed circuit board via 716. The purpose of this conductive ground plane 714 is to connect one end of the coil 702 and the other end of the coil 702 is connected with a conductor 722 that may be a flexible conductor disposed on an inside surface of the convex curved flexible substrate 704. As a force 306 is applied to the face of the convex curved flexible substrate 704, the coil 702 is compressed, thereby increasing its inductance value, compare drawing (a) to drawing (b) of FIG. 7. Electrical connections 722 and 724 are used to couple the inductor coil 702 to electronic measurement circuits (see FIG. 9) for determining the inductance value thereof.

Figure 8:
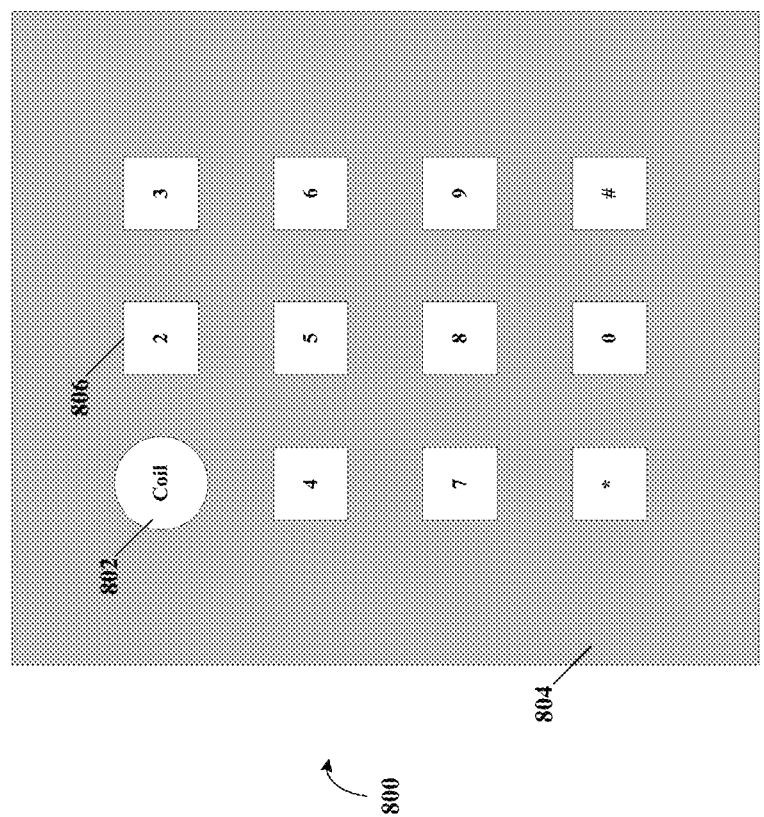
FIG. 8 illustrates a schematic frontal view of an inductive touch keypad showing an inductive sense coil that is typical for all keys of the keypad, according to specific example embodiments of this disclosure.

Referring to FIG. 8, depicted is a schematic frontal view of an inductive touch keypad showing an inductive sense coil that is typical for all keys of a keypad, according to specific example embodiments of this disclosure. A keypad, generally represented by the numeral 800, is configured as a matrix of inductive touch sensor keys 804 comprising a plurality of inductive touch sensors 802. In each one of the plurality of inductive touch sensors 802 is a coil 802 having an inductance value that changes when a force 306 is applied thereto, as more fully described hereinabove.

Figure 9:
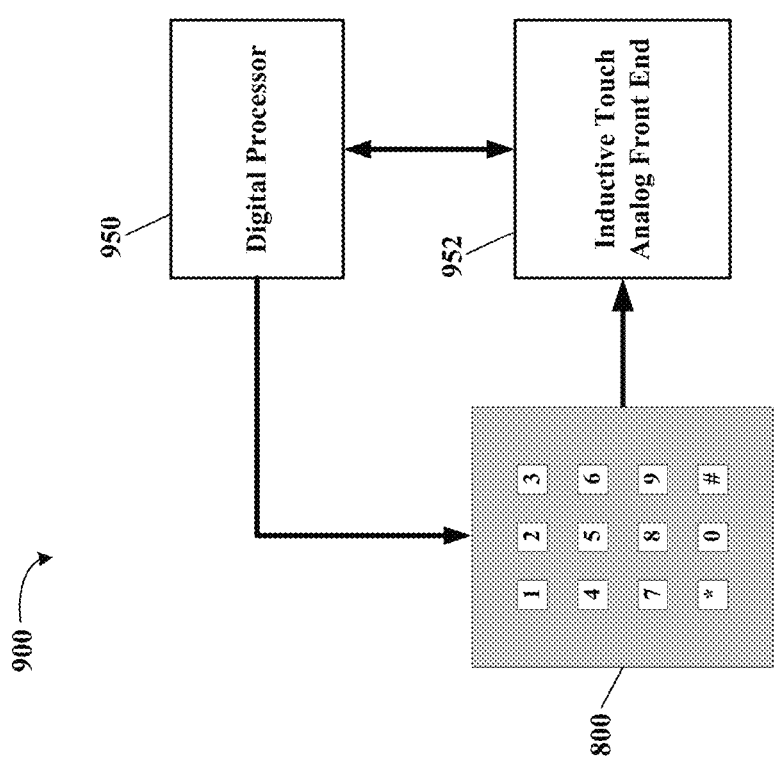
FIG. 9 illustrates a schematic block diagram of an electronic system having an inductive touch keypad as shown in FIG. 6, an inductive touch analog front end and a digital processor, according to specific example embodiments of this disclosure.

Referring to FIG. 9, depicted is a schematic block diagram of an electronic system having an inductive touch keypad as shown in FIG. 8, an inductive touch analog front end and a digital processor, according to specific example embodiments of this disclosure. A digital processor 950, e.g., a microprocessor, microcomputer, digital signal processor (DSP), application specific integrated circuit (ASIC), programmable logic array (PLA), etc., is coupled to an inductive touch analog front end (AFE) 952 and a matrix of inductive touch sensor keys 800, e.g., pushbuttons, targets, etc. The digital processor 950 and AFE 952 may be part of a mixed signal (analog and digital circuits) integrated circuit device.

The inductive touch AFE 952 facilitates, with a single low-cost integrated circuit device, all active functions used in determining when there is actuation of inductive sensors, e.g., by pressing and deflecting a target key that changes the inductance value of an associated inductive sensor. The inductive touch AFE 952 measures the inductance value of each sensor of the matrix of inductive touch sensor keys 800 and converts the inductance values into respective analog direct current (dc) voltages that are read and converted into digital values by the digital processor 950. It is contemplated and within the scope of this disclosure that standard analog components may be used to make a discrete analog front end (AFE), and that one having ordinary skill in electronic circuit design and the benefit of this disclosure could readily design such a discrete AFE.

The digital processor 950 supplies clock and control functions to the inductive touch AFE 952, reads the analog voltage detector output of the inductive touch AFE 952, and selects each key of the matrix of inductive touch sensor keys 800. When actuation of a key of the matrix of inductive touch sensor keys 800 is determined, the digital processor 950 will take an appropriate action as programmed therein.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An inductive touch sensor, comprising:
   a flexible substrate configured to be touched by an object;
   an inductor attached to or embedded within the flexible substrate such that a deformation of the flexible substrate also deforms the inductor, the inductor and the flexible substrate having a first position and a second position, wherein the flexible substrate and the inductor assume the second position when a force is applied thereto by a touch onto the flexible substrate;
   wherein the inductor has a first inductance value when in the first position and a second inductance value when in the second position, and
   an electronic circuit coupled to the inductor operable to measure inductance values thereof.

2. The inductive touch sensor according to claim 1, wherein the first inductance value is greater than the second inductance value.

3. The inductive touch sensor according to claim 1, wherein the first inductance value is less than the second inductance value.

4. The inductive touch sensor according to claim 1, wherein the inductor is formed as a spiral coil.

5. The inductive touch sensor according to claim 4, wherein the distances between the coil turns increase when the force is applied.

6. The inductive touch sensor according to claim 4, wherein the distances between the coil turns decrease when the force is applied.

7. The inductive touch sensor according to claim 1, wherein the flexible substrate and inductor are substantially flat when the force is not applied thereto, and concave when the force is applied thereto.

8. The inductive touch sensor according to claim 1, wherein the flexible substrate and inductor are convex when the force is not applied thereto, and less convex when the force is applied thereto.

9. The inductive touch sensor according to claim 1, wherein the flexible substrate and inductor are convex when the force is not applied thereto, and substantially flat when the force is applied thereto.

10. The inductive touch sensor according to claim 1, wherein the inductor is embedded in the flexible substrate.

11. The inductive touch sensor according to claim 1, wherein the inductor is coterminous with the flexible substrate.

12. The inductive touch sensor according to claim 1, further comprising:
    a support substrate; and
    ridge spacers between the support substrate and the flexible substrate, wherein the support substrate, ridge spacers and flexible substrate form a cavity.

13. The inductive touch sensor according to claim 12, wherein the cavity is filled with a flexible material.

14. The inductive touch sensor according to claim 12, further comprising a conductive ground plane in the cavity and on an inside face of the support substrate, wherein the conductive ground plane influences the second inductance value of the inductor when in the second position.

15. The inductive touch sensor according to claim 12, further comprising a magnetic material in the cavity and on an inside face of the support substrate, wherein the magnetic material influences the second inductance value of the inductor when in the second position.

16. The inductive touch sensor according to claim 15, wherein the magnetic material is selected from the group consisting of ferrite and powered iron.

17. The inductive touch sensor according to claim 1, wherein the electronic circuit is a mixed signal integrated circuit device.

18. An inductive touch sensor, comprising:
    a flexible substrate configured to be touched by an object;
    a spiral coil forming an inductor attached to or embedded within the flexible substrate such that a deformation of the flexible substrate also deforms the spiral coil, the spiral coil and the flexible substrate having a first position and a second position, wherein the flexible substrate and the spiral coil assume the second position when a force is applied thereto by a finger of a person;
    wherein the spiral coil has a first inductance value when in the first position and a second inductance value when in the second position, and
    an electronic circuit coupled to the spiral coil operable to measure inductance values thereof.

19. An inductive touch sensor, comprising:
    a mechanically operable button comprising:
       a flexible substrate configured to be touched by an object; and
       a spiral coil forming an inductor attached to or embedded within the flexible substrate such that a deformation of the flexible substrate also deforms the spiral coil, wherein the spiral coil is the only electronic component in the mechanically operable button and wherein the spiral coil and the flexible substrate having a first position and a second position, wherein the flexible substrate and the spiral coil assume the second position when a force is applied thereto by a finger of a person;
wherein the spiral coil has a first inductance value when in the first position and a second inductance value when in the second position, and
an electronic circuit coupled to the spiral coil operable to measure inductance values thereof.

\* \* \* \* \*